(12) United States Patent
Lee

(10) Patent No.: US 7,254,020 B2
(45) Date of Patent: Aug. 7, 2007

(54) FAN ASSEMBLY FOR A POWER SUPPLY

(75) Inventor: Tzung-Han Lee, Hsin-Tien (TW)

(73) Assignee: Zippy Technology Corp., Taipei Hsien (TW)

( * ) Notice: Subject to any disclaimer, the term of this patent is extended or adjusted under 35 U.S.C. 154(b) by 270 days.

(21) Appl. No.: 11/013,444

(22) Filed: Dec. 17, 2004

(65) Prior Publication Data

US 2006/0133034 A1   Jun. 22, 2006

(51) Int. Cl.
*H05K 7/20* (2006.01)
(52) U.S. Cl. ............. 361/695; 361/690; 361/694; 174/16.1; 165/122
(58) Field of Classification Search ............. None
See application file for complete search history.

(56) References Cited

U.S. PATENT DOCUMENTS

| | | | | |
|---|---|---|---|---|
| 6,074,296 A * | 6/2000 | Wu | ............. | 454/184 |
| 6,075,698 A * | 6/2000 | Hogan et al. | ............. | 361/695 |
| 6,236,564 B1 * | 5/2001 | Fan | ............. | 361/695 |
| 6,304,443 B1 * | 10/2001 | Chou | ............. | 361/695 |
| 6,316,718 B1 * | 11/2001 | Lin | ............. | 174/17 VA |
| 6,333,851 B1 * | 12/2001 | Shih | ............. | 361/695 |
| 6,468,150 B1 * | 10/2002 | Langdon et al. | ............. | 454/184 |
| 6,483,701 B1 * | 11/2002 | Ta et al. | ............. | 361/695 |
| 6,690,576 B2 * | 2/2004 | Clements et al. | ............. | 361/695 |
| 6,700,778 B1 * | 3/2004 | Wang | ............. | 361/690 |
| 6,866,577 B2 * | 3/2005 | Gough et al. | ............. | 454/184 |
| 6,894,897 B1 * | 5/2005 | Nagurny et al. | ............. | 361/695 |
| 7,108,051 B2 * | 9/2006 | Hung | ............. | 165/122 |

\* cited by examiner

*Primary Examiner*—Boris Chérvinsky
(74) *Attorney, Agent, or Firm*—Birch, Stewart, Kolasch, & Birch, LLP

(57) ABSTRACT

The present invention discloses a fan assembly for a power supply and improves the traditional installation of a fan onto a power supply that leaves insufficient spaces for designing the connecting holes as required by the existing installation specification, and mounts the fan into a power supply at a specific position by a specific fixing member and uses the fixing member to keep the fan at a specific interval from the end surface of the power supply without being in direct contact with the power supply. Therefore, the interval from the end surface provides sufficient space for the design of the ventilation holes for the airflow and the connecting holes as required by the installation specification of the power supply.

14 Claims, 8 Drawing Sheets

FAN ASSEMBLY FOR A POWER SUPPLY

FIELD OF THE INVENTION

The present invention relates to a fan assembly for a power supply, more particularly to a fan assembly mounted onto an end surface of a power supply that remains enough space for designing the connecting holes required by the specification of installing a power supply to an electronic device.

BACKGROUND OF THE INVENTION

A power supply could be considered as the most important part of an electronic device that supplies electric power for the operation of the electronic device. However, when the power supply is switching, a great deal of heat is produced due to a power loss. Thus, a power supply A1 usually comes with a fan A11 for dispersing the heat as shown in FIG. 1. The fan A11 of a power supply A1 is usually installed at an end surface of the power supply, and a through hole is disposed at a connecting hole on the end surface corresponding to an end of the fan, and the connection is usually achieved by securing a screw into the through hole to mount the fan A 11 at a fixed position. Further, the electronic device also has a connecting position according to a certain required specification to facilitate its production and assembly. Therefore, the power supply must be installed at a position corresponding to the specified connecting holes. However, one fan no longer can meet the requirement for dispersing so much heat produced by a high-power power supply. Therefore, a dual fan B11, B12 design for the power supply B1 as shown in FIG. 2. In FIG. 2, after two fans B11, B12 are installed to the power supply B 1, there will be no remaining space for the design of the connecting holes, and thus manufacturers have to think of some other designs to fix the electronic device into position. These designs may ruin the existing external look of the power supply and limit the way of installing a power supply onto an electronic device appropriately.

Please refer to FIG. 3 for the current power supply sold in the market, and such power supply C1 is equipped with two fans C11 and C12 with the design of connecting holes. From the figure, it is obvious that the design of the connecting holes is unable to meet the requirement for a universal connection at the existing installation position of the electronic device. In other words, the computer power supply must be designed according to some other specification for its assembly and installation, and thus this type of power supply cannot fully meet the universal application and needs further improvements.

SUMMARY OF THE INVENTION

Therefore, the primary objective of the present invention is to solve the foregoing problems and avoid the existing deficiencies by providing a fan assembly to improve the traditional installation of a fan onto a power supply that leaves not enough space for designing the connecting holes as required by the existing installation specification, and mounts the fan into a power supply at a specific position by a fixing member, and uses the fixing member to keep the fan at a specific interval from the end surface of the power supply without being in direct contact with the fan. Therefore, the interval between the end surface and the power supply provides enough space for the design of the ventilation holes for the airflow and the connecting holes as required by the specification of installing the power supply. Such arrangement allows the end surface of the power supply to accommodate various electronic devices of different specifications and provides more spaces for other designs, and thus the power supply in accordance with the present invention becomes popular.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
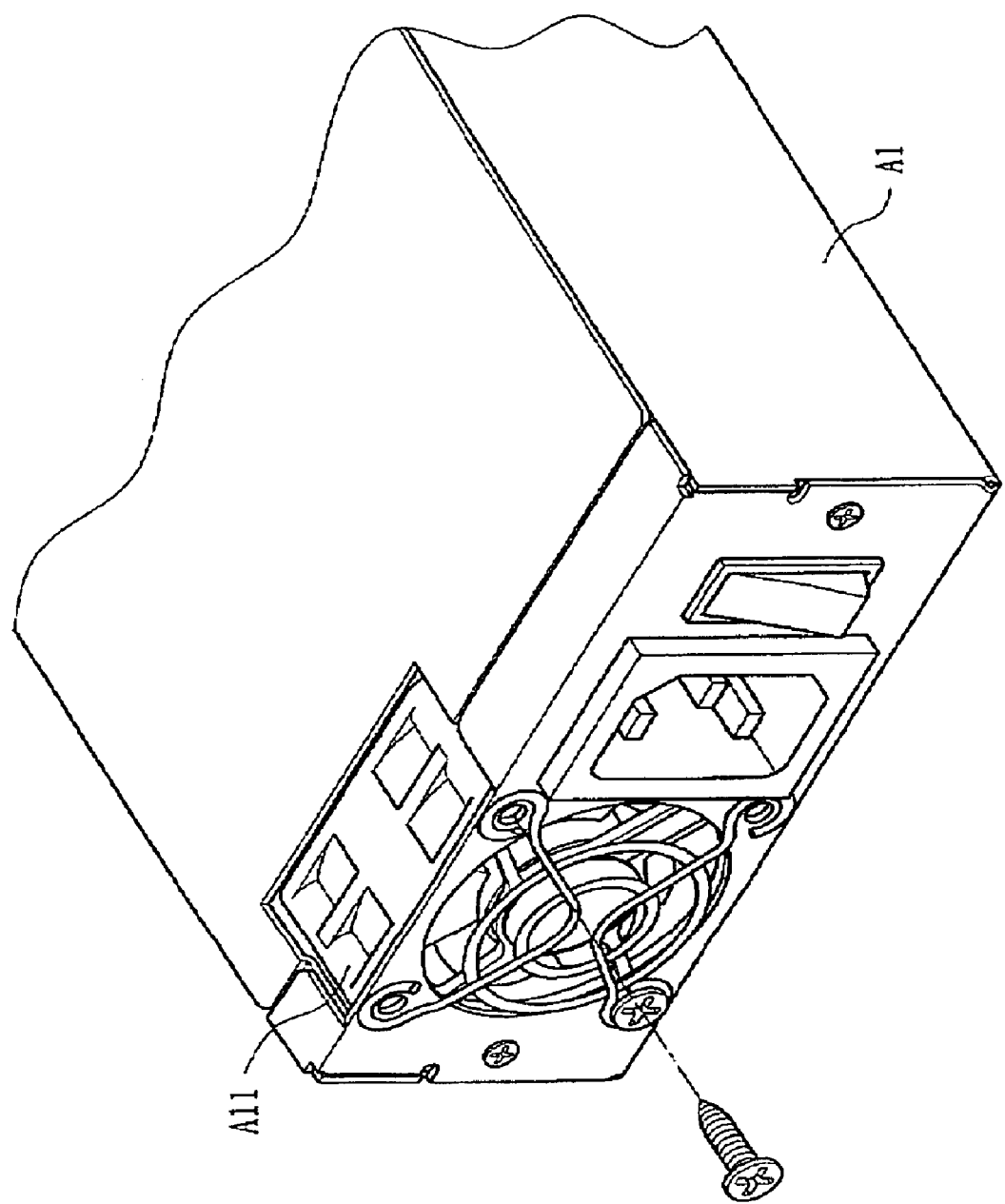
FIGS. 1, 2 and 3 are perspective views of a traditional power supply.
Figure 2:
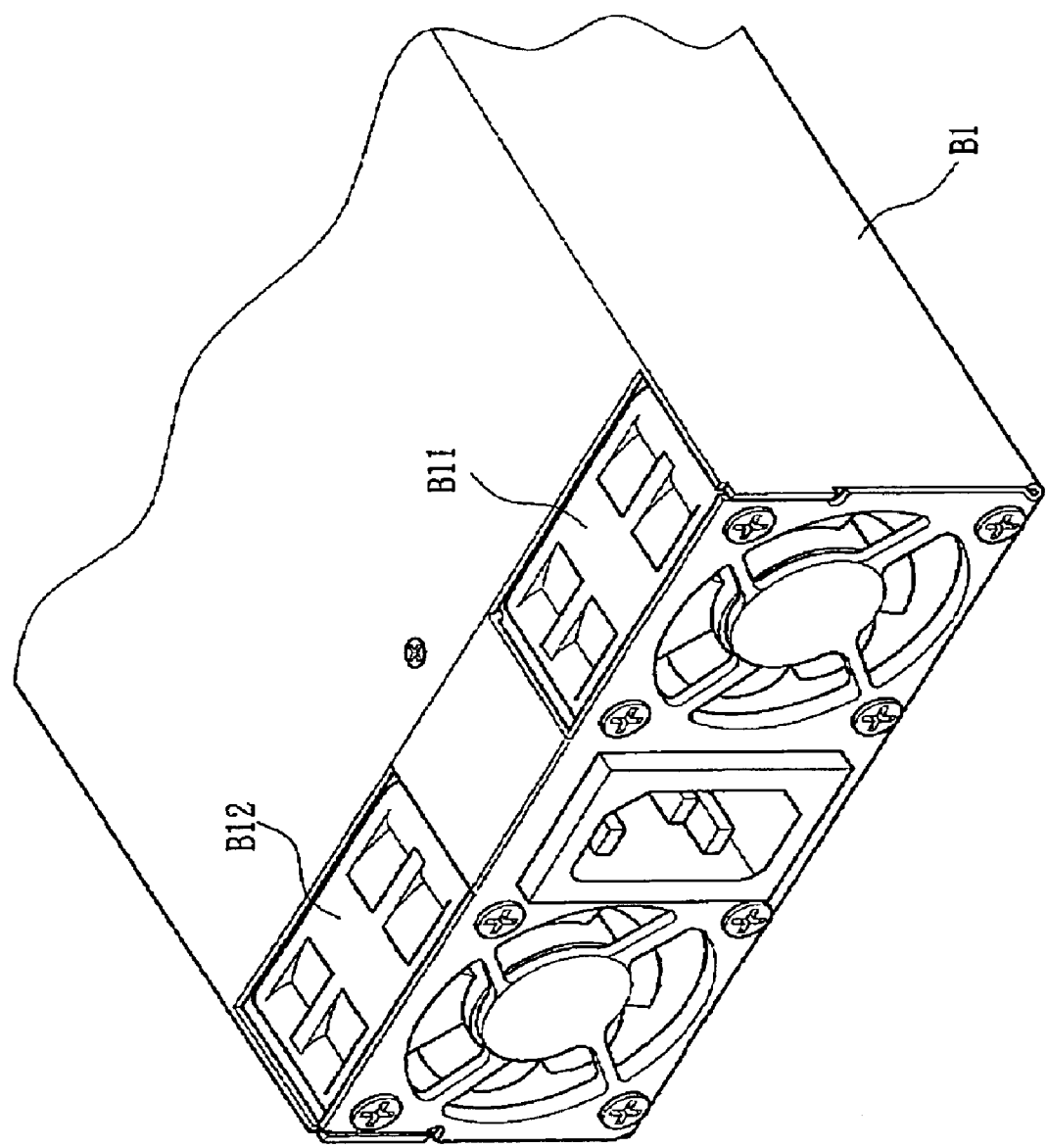
Figure 3:
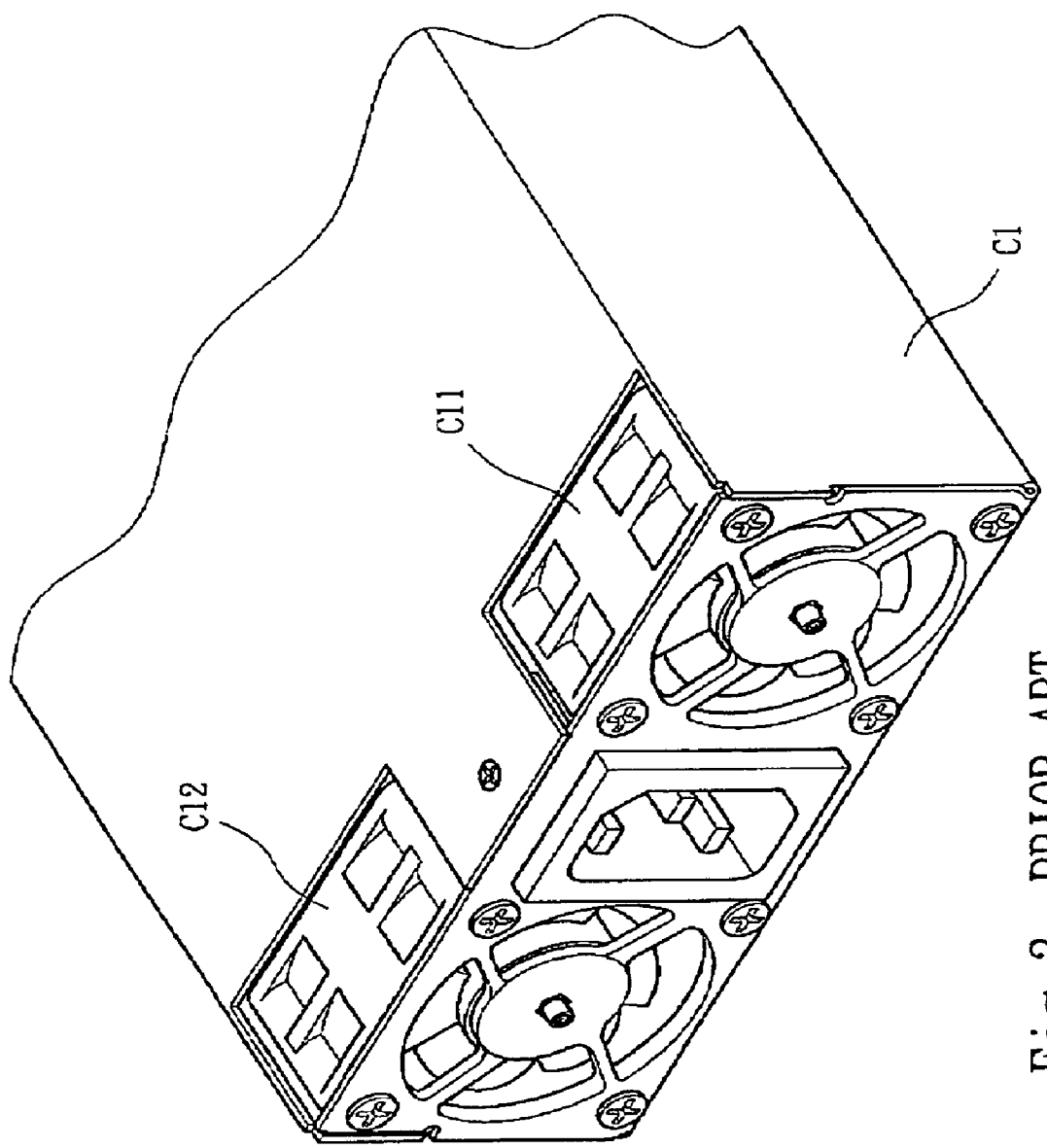
Figure 4:
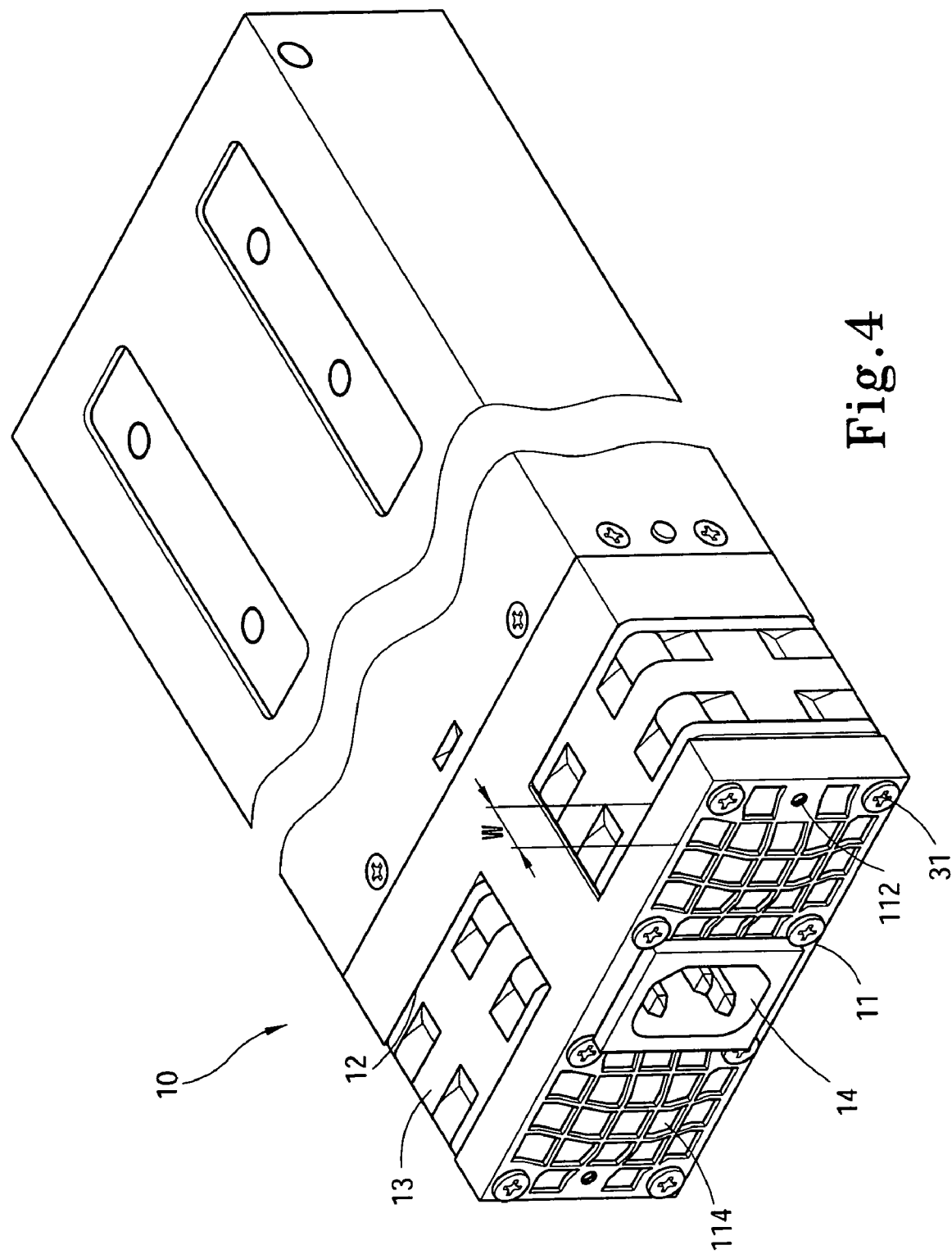
FIG. 4 is a perspective view of the present invention.
Figure 5:
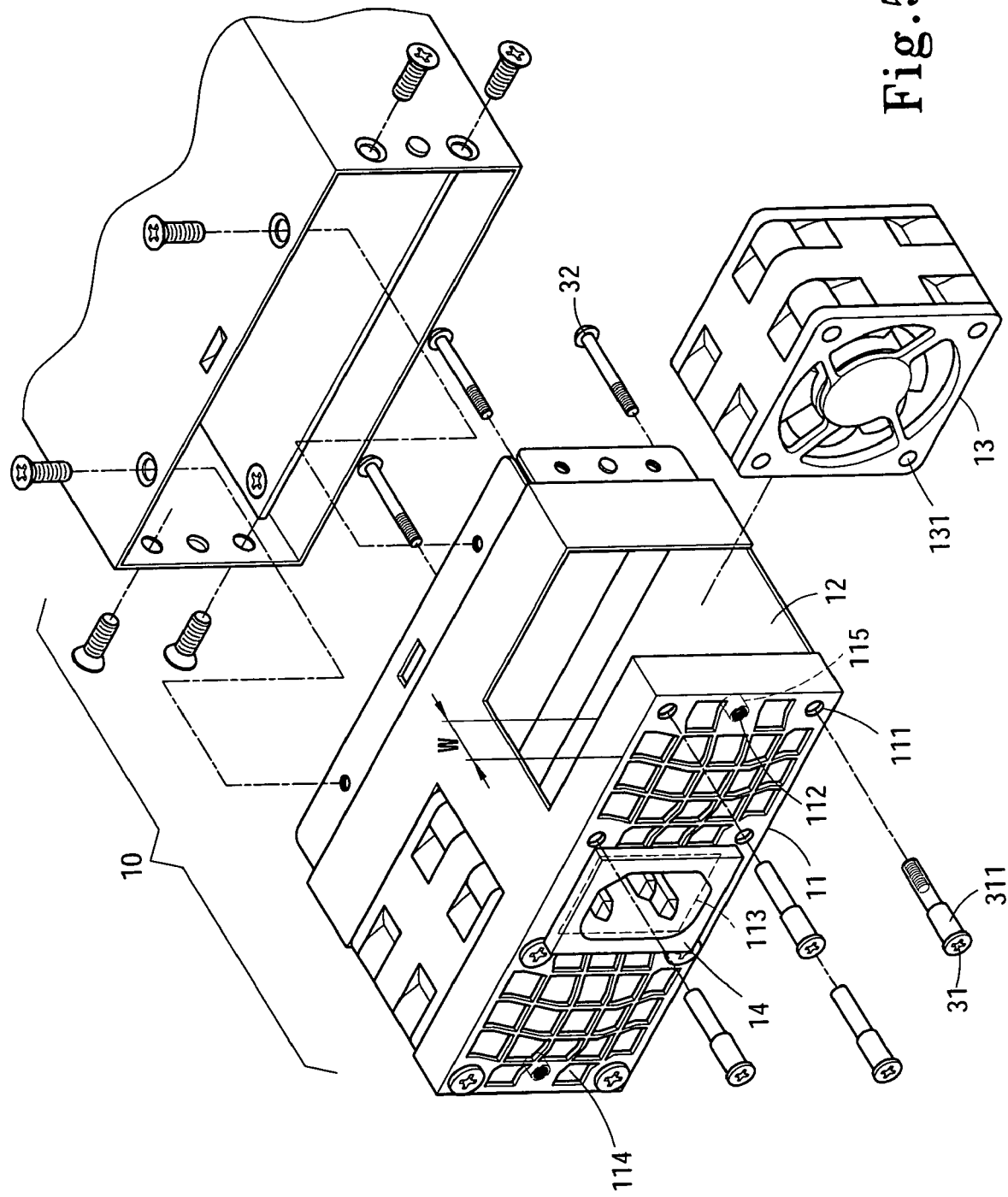
FIG. 5 is an exploded view of the structure of the present invention.
Figure 6:
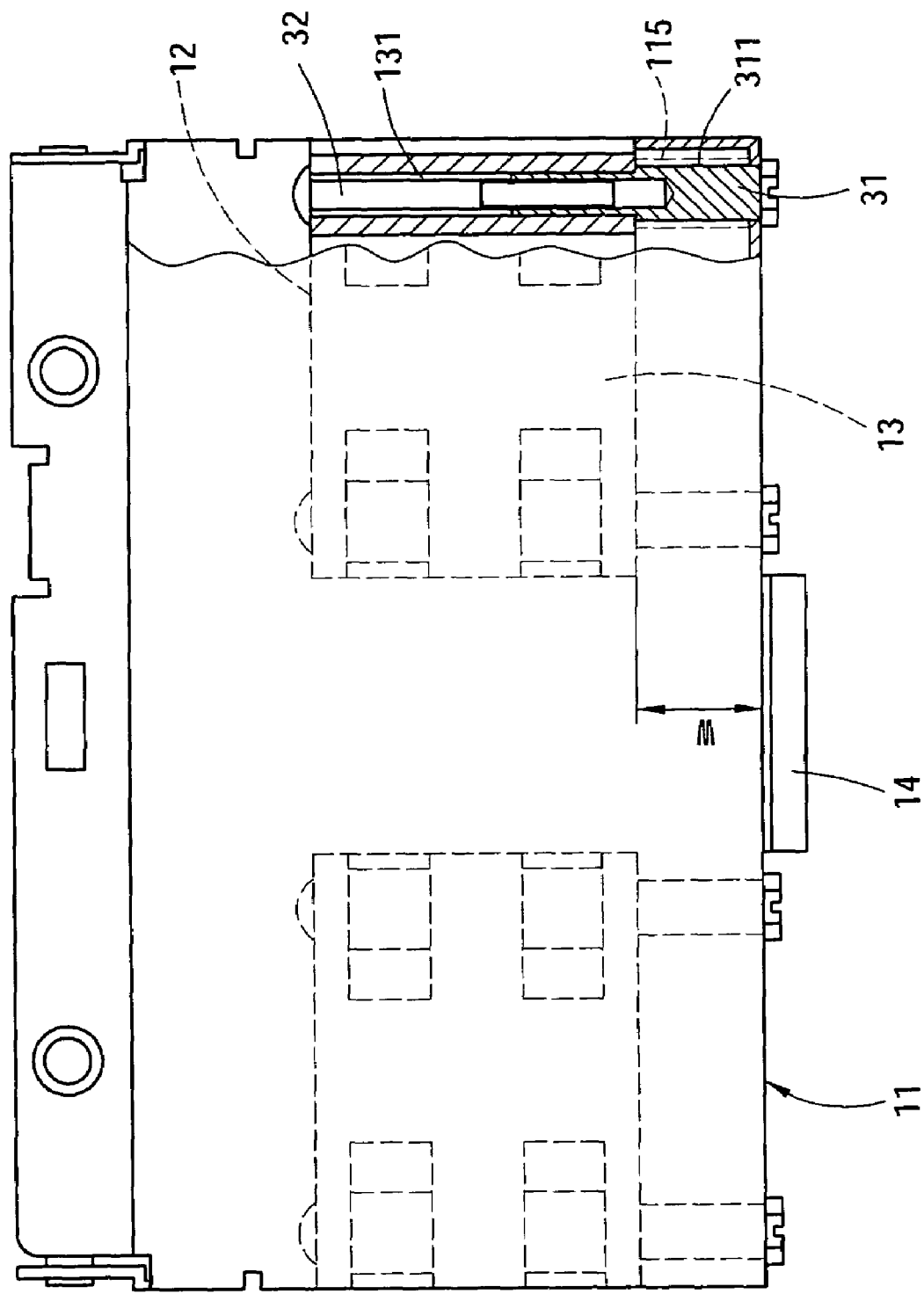
FIG. 6 is a schematic view of the invention according to another preferred embodiment of the present invention.
Figure 7:
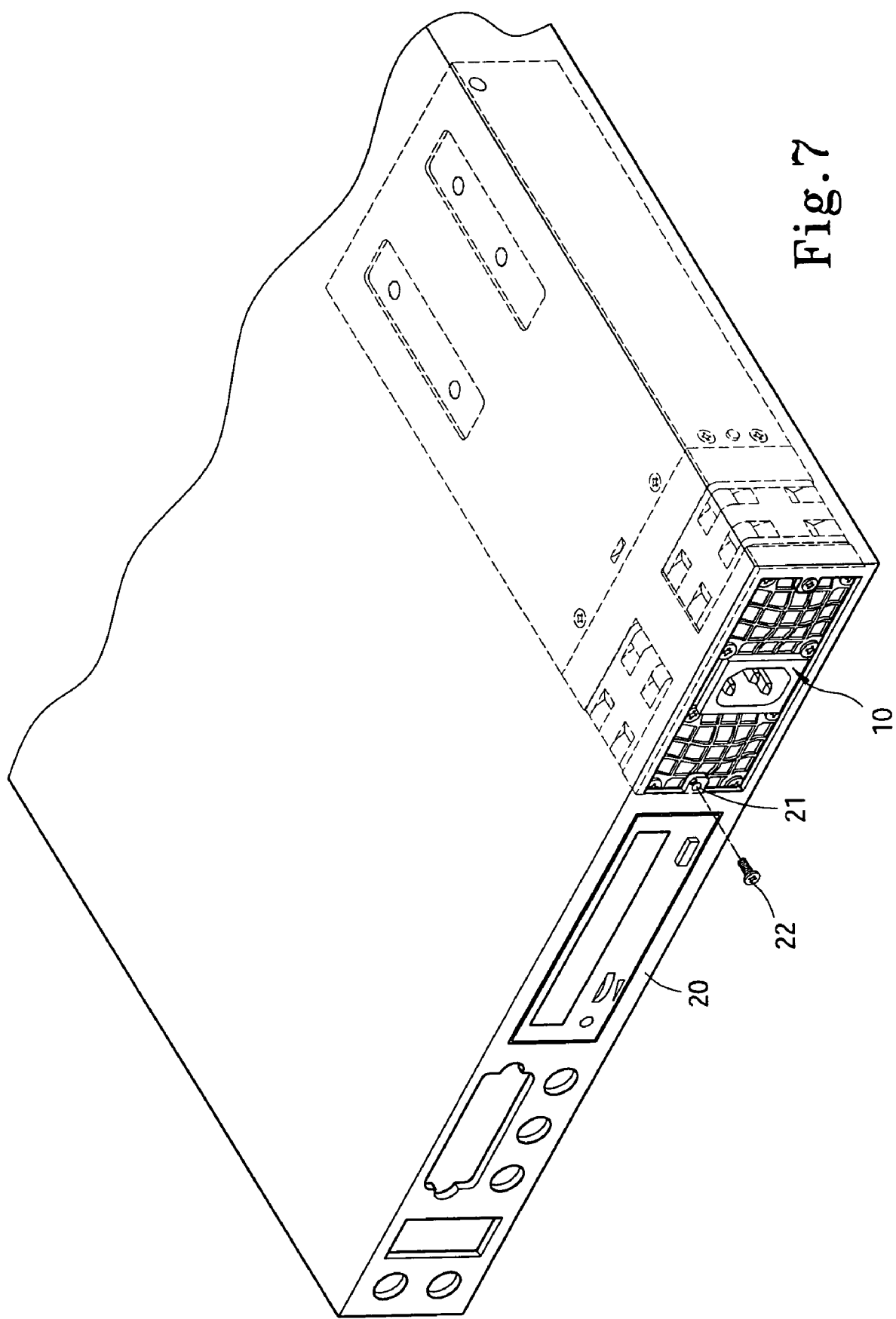
FIG. 7 is a perspective view of the present invention with the installed electronic device.

The above and other objects, features, and advantages of the present invention will become apparent from the following detailed description taken with the accompanying drawing.

Please refer to FIGS. 4 to 7 for the perspective view, the exploded view, the schematic view of the structure and the schematic view of the structure with an installed electronic device 20 according to the present invention. In the figures, the present invention comprises a fan assembly 13 of a power supply 10 and the power supply is installed in an electronic device 20, and the electronic device 20 has an installation position 21 for installing the power supply 10 onto the electronic device 20; wherein a fan 13 is installed on any end surface 11 of the power supply 10 for dispersing heat. The size and quantity of the fan 13 follow the existing specification for the corresponding power supply 10, and the embodiment of the present invention adopts the design of dual fans 13, and the end surface 11 further comprises a connecting hole 113 for installing a power supply port 14 disposed between two fans 13. The foregoing fan 13 is fixed into the power supply 10 by a fixing member, and the fixing member keeps the fan 13 at a specific interval W from the end surface 11 without being in direct contact with the power supply 10, such that a ventilation hole 114 can be designed on the end surface 11 and a connecting hole 112 required for installing the power supply 10 can be designed correspondingly to the installing position 21. The end surface 11 according to the first preferred embodiment has a through hole 111 corresponding to a connecting hole 131 disposed at an end of the fan 13 and the fixing member includes a first member 31 passing through the through hole to the connecting hole 131 and a second member 32 passing from the rear end of the connecting hole 131 to couple with the first member 31, and the first member 31 and the second member 32 comprise the corresponding internal screw thread and external screw thread respectively. The power supply 10 of this preferred embodiment comprises a limit groove 12 disposed at the connecting position of the fan 13, and the limit groove 12 defines an interval W between the fan 13 and the end surface 11. Please refer to FIG. 6. If the fan is installed inside the power supply 10, then the fixing member further comprises a sheath 311 having an external diameter larger than the diameter of the through hole to define the interval, and the sheath 311 also has an external diameter larger than the diameter of the connecting hole 131 (the sheath could also be integrally formed with the first member 31), so that the installing position of the fan can keep a specific interval W from the end surface 11 by means of the fixing member. Therefore the end surface 11 of the power supply only maintains the ventilation hole 114 for the fan 13 to guide and disperse heat as well as provides sufficient spaces for the design to fit the existing installing position 21 of the connecting hole 112 as required by the existing installation specification of the electronic device 20. In the preferred embodiment of the present invention, the fan 13 is preferably installed at a position not exceeding to the depth of the power supply port, so that it is not necessary to increase the length of the power supply 19 for applying the present invention to various electronic devices 20.

Figure 8:
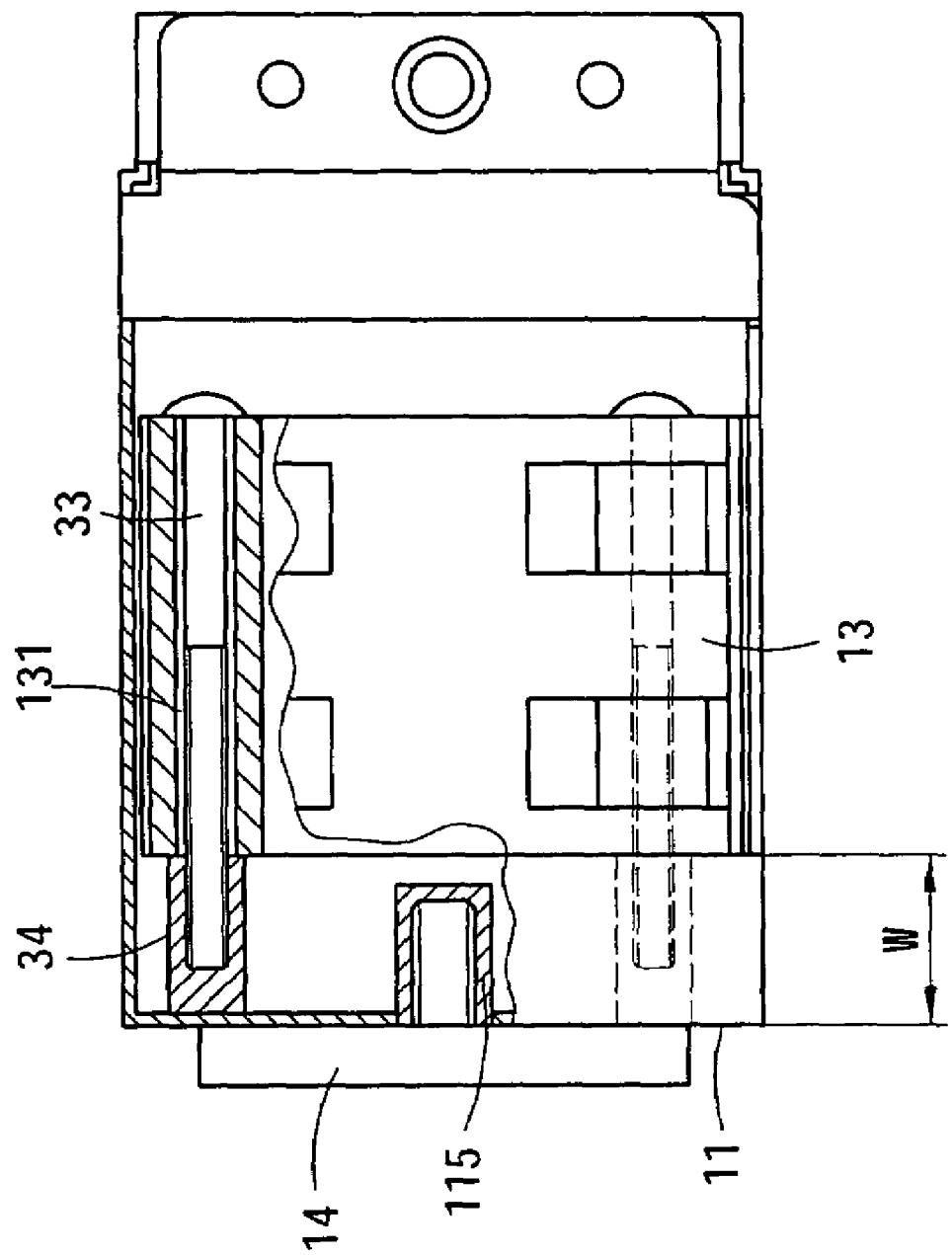
FIG. 8 is a schematic view of the structure according to another preferred embodiment of the present invention

Please refer to FIG. 8 for another preferred embodiment of the present invention. The fixing member has various different modes according to the design concept of the present invention, and the fixing member in this embodiment comprises a connecting hole 131 disposed at an end of the fan 13, a spacer 34 disposed on the end surface 11, and a locking member 33 passing from the rear end of the connecting hole 131 to couple with the spacer 34. Similarly, the spacer 34 and the locking member 33 comprise the corresponding screw threads to define the assembly. The spacer 34 could act as a component that keeps an interval W between the fan 13 and the end surface 11 if the limit groove 12 is not included in the design of the power supply 10.

Since there is an interval W between the fan 13 and the end surface 11, a reinforced member 115 can be built at the position of the connecting hole 112 as to provide an installation position 21 for the electronic device 20 and the limit screw member 22 at the connecting hole 112 for securely coupling with the reinforced member 115 to strengthen the connection between the power supply 10 and the electronic device 20.

While the invention has been described by means of specific embodiments, numerous modifications and variations could be made thereto by those skilled in the art without departing from the scope and spirit of the invention set forth in the claims.

What is claimed is:

1. A fan assembly for a power supply, comprising a fan installed at an end surface of a power supply for dispersing heat, said fan being installed and fixed in said power supply by a fixing member, and said fixing member keeping said fan at a predetermined interval from said end surface of the power supply without the fan being in direct contact with said power supply, such that said interval allows a ventilation hole to be disposed on said end surface and a connecting hole designed at a connecting position for installing a power supply to a corresponding electronic device.

2. The fan assembly for a power supply of claim 1, wherein said end surface further comprises an installation hole for installing a power supply port.

3. The fan assembly for a power supply of claim 2, wherein said fan is installed at a position not exceeding a depth of said power supply port.

4. The fan assembly for a power supply of claim 1, wherein said power supply comprises a limit groove disposed at the connecting position of said fan to define said interval.

5. The fan assembly for a power supply of claim 1, wherein said end surface comprises a through hole corresponding to said connecting hole disposed at an end of said fan, and said fixing member comprises a first member passing through said through hole to said connecting hole and a second member passing from the rear end of said connecting hole for coupling said first member.

6. The fan assembly for a power supply of claim 5, wherein said power supply comprises a limit groove disposed at the connecting position of said fan to define said interval.

7. The fan assembly for a power supply of claim 5, wherein said first member and said second member comprise a corresponding internal screw thread and a corresponding external screw thread respectively.

8. The fan assembly for a power supply of claim 5, wherein said fixing member comprises a sheath having an external diameter larger than the diameter of said through hole to define said interval.

9. The fan assembly for a power supply of claim 8, wherein said sheath has an external diameter larger than the diameter of said connecting hole.

10. The fan assembly for a power supply of claim 1, wherein said fixing member comprises a connecting hole corresponsive to an end of said fan, a spacer disposed on said end surface, and a locking member passing from the rear end of said connecting hole to couple with said spacer.

11. The fan assembly for a power supply of claim 10, wherein said power supply comprises a limit groove disposed at the connecting position of said fan to define said interval.

12. The fan assembly for a power supply of claim 1 further comprising a reinforced member disposed at the position of said connecting hole.

13. The fan assembly for a power supply of claim 1, wherein the ventilation hole and the connecting hole for the power supply are in a same plane on a face of the fan assembly.

14. The fan assembly for a power supply of claim 1, wherein the fixing member has a side opening for insertion of the fan, the fan being moved in a direction perpendicular to the predetermined interval during installation through the side opening.

* * * * *